US009732438B2

United States Patent
Mueller et al.

(10) Patent No.: US 9,732,438 B2
(45) Date of Patent: Aug. 15, 2017

(54) METHOD FOR PRODUCING A VANADIUM-DOPED SILICON CARBIDE VOLUME MONOCRYSTAL, AND VANADIUM-DOPED SILICON CARBIDE SUBSTRATE

(71) Applicant: SICRYSTAL AG, Nuremberg (DE)

(72) Inventors: Ralf Mueller, Fuerth (DE); Matthias Stockmeier, Erlangen (DE); Michael Vogel, Nuremberg (DE)

(73) Assignee: SiCrystal AG, Nuernberg (DE)

( * ) Notice: Subject to any disclaimer, the term of this patent is extended or adjusted under 35 U.S.C. 154(b) by 0 days.

(21) Appl. No.: 14/848,560

(22) Filed: Sep. 9, 2015

(65) Prior Publication Data
US 2016/0068994 A1 Mar. 10, 2016

(30) Foreign Application Priority Data
Sep. 9, 2014 (DE) .......................... 10 2014 217 956

(51) Int. Cl.
*B32B 3/00* (2006.01)
*C30B 23/02* (2006.01)
(Continued)

(52) U.S. Cl.
CPC ............ *C30B 23/02* (2013.01); *C30B 23/005* (2013.01); *C30B 29/36* (2013.01); *H01B 1/04* (2013.01)

(58) Field of Classification Search
CPC ....... C30B 23/005; C30B 23/02; C30B 25/02; C30B 29/36; H01B 1/04
See application file for complete search history.

(56) References Cited

U.S. PATENT DOCUMENTS

| 5,611,955 A | 3/1997 | Barrett et al. |
| 6,396,080 B2 | 5/2002 | Carter, Jr. et al. |

(Continued)

FOREIGN PATENT DOCUMENTS

| DE | 102008063124 B4 | 5/2013 |
| DE | 102008063129 B4 | 5/2013 |

(Continued)

OTHER PUBLICATIONS

Reshanon, Sergey A., Diamond and Related Materials 9 (2000) 480-482, Growth and high temperature performance of semi-insulating silicon carbide, Department of Microelectronics, St. Petersburg State Electrotechnical University, Prof. Popov str. 5, 197376 St. Petersburg, Russia.

*Primary Examiner* — Elizabeth Mulvaney
(74) *Attorney, Agent, or Firm* — Laurence A. Greenberg; Werner H. Stemer; Ralph E. Locher (57) ABSTRACT

A silicon-carbide volume monocrystal is produced with a specific electrical resistance of at least $10^5$ Ωcm. An SiC growth gas phase is generated in a crystal growing area of a crucible. The SiC volume monocrystal grows by deposition from the SiC growth gas phase. The growth material is transported from a supply area inside the growth crucible to a growth boundary surface of the growing monocrystal. Vanadium is added to the crystal growing area as a doping agent. A temperature at the growth boundary surface is set to at least 2250° C. and the SiC volume monocrystal grows doped with a vanadium doping agent concentration of more than $5 \cdot 10^{17}$ cm$^{-3}$. The transport of material from the SiC supply area to the growth boundary surface is additionally influenced. The growing temperature at the growth boundary surface and the material transport to the growth boundary surface are influenced largely independently of one another.

13 Claims, 6 Drawing Sheets

(51) Int. Cl.
*C30B 29/36* (2006.01)
*H01B 1/04* (2006.01)
*C30B 23/00* (2006.01)

(56) References Cited

U.S. PATENT DOCUMENTS

| | | |
|---|---|---|
| 8,216,369 B2 | 7/2012 | Gupta et al. |
| 8,795,624 B2 | 8/2014 | Nakabayashi et al. |
| 2010/0159182 A1 | 6/2010 | Straubinger et al. |
| 2012/0103249 A1 | 5/2012 | Gupta et al. |
| 2013/0153836 A1 | 6/2013 | Miyamoto |

FOREIGN PATENT DOCUMENTS

| | | |
|---|---|---|
| EP | 1807557 B1 | 7/2010 |
| EP | 1874985 B1 | 3/2011 |
| WO | 02097173 A2 | 12/2002 |
| WO | 2006041067 A1 | 4/2006 |
| WO | 2010111473 A1 | 9/2010 |

METHOD FOR PRODUCING A VANADIUM-DOPED SILICON CARBIDE VOLUME MONOCRYSTAL, AND VANADIUM-DOPED SILICON CARBIDE SUBSTRATE

CROSS-REFERENCE TO RELATED APPLICATION

This application claims the priority, under 35 U.S.C. 119, of German patent application 10 2014 217 956.4, filed Sep. 9, 2014; the content of the prior application is herewith incorporated by reference in its entirety.

BACKGROUND OF THE INVENTION

Field of the Invention

The invention relates to a method for the production of a SiC volume monocrystal as well as a monocrystalline SiC substrate.

The semiconductor material silicon carbide (=SiC) is often used as a substrate material for high-frequency components because of its excellent physical, chemical and electrical properties. Here it is important to ensure that there is as little interaction as possible between the actual component and the substrate material, in order to avoid losses. This is achieved for example in that the monocrystalline SiC substrate has the highest possible electrical resistance as well as also having a high crystalline quality. To produce a high resistance SiC volume monocrystal or an SiC substrate produced therefrom it is necessary to compensate for flat imperfections existing within the crystal as a result of impurities or intrinsic defects. A high resistance SiC volume monocrystal produced in this way is also referred to as being semi-insulating.

To compensate for said flat imperfections, which are caused in particular by nitrogen-impurities and preferably have a donor effect, a method is described in U.S. Pat. No. 6,396,080 B2 and its counterpart WO 02/097173 A2 in which in addition to vanadium-doping in a concentration of vanadium of at most $1 \cdot 10^{16}$ cm$^{-3}$ intrinsic defects are generated specifically during the crystal growing. In this way specific resistance values of about $10^5$ Ωcm to a maximum of about $10^{10}$ Ωcm can be achieved, but because of the very sensitive processing required often only values of about $10^6$ Ωcm are achieved. The formation of suitable intrinsic defects is heavily dependent on the processing parameters during the crystal growing, so that even very small processing fluctuations result in an inhomogeneous distribution of defects and thereby resistance. Furthermore, such specifically introduced intrinsic defects can heal themselves during thermal loading, which can result in an inhomogeneous distribution of resistance or even a total loss of high-resistance properties.

U.S. Pat. No. 5,611,955 describes a different method for compensating flat imperfections. In this case extrinsic deep imperfections are made specifically in the SiC volume monocrystal. To compensate for the nitrogen background doping (=nitrogen impurities) vanadium is used with a vanadium content of 300 to 1000 weight ppm as a specifically introduced doping agent. In this way specific resistance values of $10^{11}$ Ωcm can be achieved.

German patent DE 10 2008 063 124 B4 describes a method for growing semi-insulating SiC with a specific electrical resistance of up to $10^{11}$ Ωcm. Vanadium is incorporated homogenously into the SiC crystal structure as the doping agent in a doping agent concentration of up to $5 \cdot 10^{17}$ cm$^{-3}$. The vanadium doping agent is supplied by means of a structurally relatively complex external gas supply line. A structurally similar growth arrangement is described in published patent application No. US 2010/0159182 A1 and its counterpart German patent DE 10 2008 063 129 B4. In the method described there, in addition to the vanadium doping, an additional doping is performed with a doping agent acting like an acceptor and overcompensating for donor-like impurities, e.g. aluminium or boron. The resistance values of the thus grown semi-insulating SiC volume monocrystal are up to $10^{12}$ Ωcm.

European patent EP 1 807 557 B1 describes an additional growth method for semi-insulating SiC in which vanadium doping is performed. The concentration of vanadium doping agent is at most $5 \cdot 10^{17}$ cm$^{-3}$. However, in a position close to the SiC seed crystal a disc-liked SiC substrate (=wafer) has been cut out of a grown SiC volume monocrystal, which wafer at at least one point had a greater local vanadium concentration of $8.78 \cdot 10^{17}$ cm$^{-3}$. As this concentration was over the solubility limit vanadium precipitations were formed here. The vanadium was thus not incorporated as an active doping agent in this area into the SiC crystal structure.

The solubility limit of vanadium as a doping agent incorporated into a monocrystalline 4H-SiC or 6H-SiC is described in the specialist article "Deep level transient spectroscopic and Hall effect investigation of the position of vanadium acceptor level in 4H and 6H SiC", by J. R. Jenny et al, from Applied Physics Letters, 68 (14), 01.04.1996, pages 1963 to 1965, with $3 \cdot 10^{17}$ cm$^{-3}$.

European patent EP 1 874 985 B1 describes a further method for growing semi-insulating SiC with a specific electrical resistance in a range between $10^5$ Ωcm and $2 \cdot 10^{11}$ Ωcm (or possibly even greater). As the doping agent, vanadium is incorporated into the grown SiC volume monocrystals in a doping agent concentration in a range between $2 \cdot 10^{14}$ cm$^{-3}$ and $1.4 \cdot 10^{17}$ cm$^{-3}$. It is also specified that the vanadium doping agent concentration is below the solubility limit. The vanadium doping agent is supplied by means of a structurally also relatively complex doping agent container, which is tightly sealed apart from specifically inserted and specifically calibrated capillary openings.

SUMMARY OF THE INVENTION

It is accordingly an object of the invention to provide a method for producing vanadium doped SiC which overcomes the above-mentioned and other disadvantages of the heretofore-known devices and methods of this general type and which provides for an improved method compared to known solutions for the production of a SiC volume monocrystal and an improved monocrystalline SiC substrate.

With the foregoing and other objects in view there is provided, in accordance with the invention, a method for the production of at least one SiC volume monocrystal with a specific electrical resistance of at least $10^5$ Ωcm, the method comprising:

a) producing an SiC growth gas phase in at least one crystal growing area of a growth crucible and growing the SiC volume monocrystal by deposition from the SiC growth gas phase;

b) supplying the SiC growth gas phase from an SiC source material that is located in an SiC supply area inside the growth crucible, wherein material is transported from the SiC supply area to a growth boundary surface of the growing SiC volume monocrystal;

c) supplying vanadium as a doping agent of the growing SiC volume monocrystal to the crystal growing area;

d) setting a growing temperature of at least 2250° C. at the growth boundary surface of the growing SiC volume monocrystal, to grow the SiC volume monocrystal doped with a vanadium doping agent concentration of more than $5 \cdot 10^{17}$ cm$^{-3}$; and e) setting the transport of material from the SiC supply area to the growth boundary surface in addition to the temperature conditions in the growth crucible by way of an additional transport influencing measure (18; 25; 28; 31; 41), so that the growing temperature at the growth boundary surface and the transport of material to the growth boundary surface is influenced substantially independently of one another.

In other words, to address the problems relating to the method the following is provided. The invention is a method for the production of at least one SiC volume monocrystal with a specific electrical resistance of at least $10^5$ Ωcm and in particular of at most $10^{12}$ Ωcm, wherein in at least one crystal growing area of a growth crucible an SiC growth gas phase is generated and the SiC volume monocrystal grows by deposition from the SiC growth gas phase, and the SiC growth gas phase is fed from a SiC source material located in a SiC supply area inside the growth crucible. In this case material is transported from the SiC supply area to a growth boundary surface of the growing SiC volume monocrystal located in particular in the crystal growing area. Furthermore, vanadium is supplied to the crystal growing area as a doping agent of the growing SiC volume monocrystal, in particular in a gaseous form. Furthermore, at the growth boundary surface of the growing SiC volume monocrystal a growing temperature is set of at least 2250° C. and in particular at most 2500° C., preferably between 2350° C. and 2450° C., so that the SiC volume monocrystal grows doped with a vanadium doping agent concentration of more than $5 \cdot 10^{17}$ cm$^{-3}$ and in particular at most $1 \cdot 10^{19}$ cm$^{-3}$. Furthermore, the transport of material from the SiC supply area to the growth boundary surface is controlled, in addition to the temperature conditions in the growth crucible, by means of an additional transport influencing means, so that the growing temperature at the growth boundary surface and the material transport to the growth boundary surface can be influenced at least largely independently of one another (i.e., substantially independently, or entirely independently, of one another).

It has been recognized that vanadium can be incorporated into the growing SiC volume monocrystal in a doping agent concentration which is above the concentration of about $3 \cdot 10^{17}$ cm$^{-3}$ to $5 \cdot 10^{17}$ cm$^{-3}$ previously assumed to be the solubility limit of vanadium in monocrystalline SiC. For this at the growth boundary of the growing SiC volume monocrystal a higher growing temperature is set than is usually the case in previous growth methods for semi-insulating SiC volume monocrystals. Said growing temperature is at least 2250° C., in particular at least 2350° C., and can for example also have values of above 2400° C. or even above 2450° C. In this way, vanadium can be embedded or incorporated more advantageously in an extremely high doping agent concentration of above $5 \cdot 10^{17}$ cm$^{-3}$, in particular at least $6 \cdot 10^{17}$ cm$^{-3}$, preferably at least $7.5 \cdot 10^{17}$ cm$^{-3}$ and most preferably at least $2 \cdot 10^{18}$ cm$^{-3}$ into the growing SiC volume monocrystal. In particular, the SiC volume monocrystal doped with a vanadium doping agent concentration of more than $5 \cdot 10^{17}$ cm$^{-3}$ grows free of macroscopic vanadium precipitations. Macroscopic vanadium precipitations are defined in particular to be those with a lateral extension of more than 1 µm. Preferably, the SiC volume monocrystal doped with vanadium grows completely free of precipitations. Owing to the higher growing temperature at the growth boundary surface the solubility limit for vanadium in monocrystalline SiC can be increased in particular to $1 \cdot 10^{19}$ cm$^{-3}$. In any case, up to this vanadium doping agent concentration no significant vanadium precipitations are formed. The absence of precipitations is advantageous with respect to achieving the highest possible electrical effect of the doped vanadium and also with respect to having as few defects as possible in the growing SiC volume monocrystal.

The vanadium atoms incorporated into the SiC volume monocrystal are thus in particular electrically active or effective at least to a large extent or even as a whole. In particular, the latter are used for compensating flat imperfections. As a result of the high vanadium doping agent concentration incorporated into the crystal lattice a greater number of such flat imperfections can be compensated than in previously known methods, so that SiC volume monocrystals, which previously had to be disposed of because they had too many flat imperfections, in the growth method according to the invention still have the desired the semi-insulating behaviour. The reject rate is thus reduced. The specific resistance values of SiC volume monocrystals grown by the method according to the invention are high and are in particular $10^{10}$ Ωcm or above, preferably even $10^{11}$ Ωcm or above. The resistance values given here and in the following are always at ambient temperature.

In order to avoid the possibly undesirable effects of a change in the temperature conditions associated with the higher growing temperature at the growth boundary surface and possibly also at another point in the growth crucible, in the method according to the invention there is mostly a separation between setting the growing temperature at the growth boundary surface and setting the transport of material to the growth boundary surface and setting possibly additional growth conditions. Said advantageous decoupling is achieved by the additional transport influencing measure. In this way despite the high growing temperature high quality SiC volume monocrystals can be grown with few defects.

Apart from the growing temperature during the growing of the SiC volume monocrystal in particular the following growth conditions are set in the growth crucible. A source temperature in the supply area is preferably between 2400° C. and 2700° C., more preferably between 2450° C. and 2550° C. A difference in temperature between said source temperature and the growing temperature at the growth boundary surface is preferably between 100° C. and 250° C., more preferably between 100° C. and 150° C. A growing pressure in the growth crucible is between 1 hPa (=mbar) to 50 hPa (=mbar), more preferably between 5 hPa (=mbar) to 10 hPa (=mbar).

On the whole by means of the growth method according to the invention SiC volume monocrystals can be produced from which high-quality semi-insulating SiC substrates can be obtained. Such SiC substrates with high precision in their SiC crystal structure provide almost perfect conditions for the subsequent processing steps to be performed during the production of components. SiC volume monocrystals produced according to the invention can thus be processed further very efficiently, in particular for the production of semi-conductor and/or high-frequency components.

By means of the method according to the invention a single SiC volume monocrystal, but also a larger number, for example two, three, four, five or also preferably up to ten SiC volume monocrystals can be produced. A method is advantageous in which two SiC volume monocrystals are grown which are arranged above one another or behind one another in particular in the direction of the central longitudinal axis, which grow in the direction of the central longitudinal axis on both sides of the SiC supply area.

According to an advantageous embodiment at least one gas-permeable membrane of porous material is arranged between the SiC supply area and the crystal growing area as an additional transport influencing means. In particular, the SiC source material is covered by the gas-permeable membrane. The porous material is in particular porous graphite with a density of preferably between 0.8 g/cm$^{-3}$ and 1.6 g/cm$^{-3}$, and more preferably 1.2 g/cm$^{-3}$. The permeability of the membrane for the (SiC) gas species can be adjusted very easily and also within broad limits by the density and possibly also by the thickness of the porous membrane. By means of the permeability of the membrane the transport of material to the growth boundary surface can be adjusted specifically. The gas permeable membrane provides a very efficient separation of the transport of material to the growth boundary surface and setting the growing temperature at the growth boundary surface. By adapting the membrane accordingly the growing temperature can be increased at the growth boundary surface relative to a growth arrangement without a membrane by 50° C. to 250° C., in particular by about 150° C., at the same growth speed. Thus, it is possible to achieve a higher vanadium doping agent concentration in the growing SiC volume monocrystal.

According to a further advantageous embodiment as an additional transport influencing means during the transport of material from the SiC supply area and to the growth boundary surface at least one resublimation step is performed. In particular, the SiC source material located in the SiC supply area changes by means of sublimation into the gaseous state from where it is precipitated firstly at a defined point between the SiC supply area and the growth boundary surface (resublimated or condensed). From this solid intermediate stage the material is sublimated again in order to then reach the actual crystal growing area. If necessary the resublimation can also be performed in several stages, i.e. sublimation and precipitation (or resublimation or condensation) can be performed several times one after the other before the SiC gas species reaches the crystal growing area. In addition, such a possibly multiple resublimation performs a very efficient decoupling of the transport of material to the growth boundary surface and the setting of the growing temperature at the growth boundary surface.

According to a further advantageous embodiment a powdered, in particular granular SiC material is used with a specific density in a range of between 0.8 g/cm$^3$ and 3.2 g/cm$^3$ as an additional transport influencing means for the SiC source material which is introduced into the SiC supply area. By varying the density of the SiC source material the sublimation temperature can be changed. The higher the density of the SiC source material—and thus in particular the smaller the free surface of the SiC source material—the higher the sublimation temperature. By using a SiC source material with a high density, preferably the temperature of the whole growth arrangement comprising the supply area with the SiC source material up to the crystal growing area with the seed crystal and growth boundary surface, on which the SiC volume monocrystal grows, can be increased without changing the growth speed.

According to a further advantageous embodiment the vanadium to be incorporated as a doping agent into the growing SiC volume monocrystal, before the actual growth of the SiC volume monocrystal, can be added to the SiC source material or incorporated into an open doping agent container which is placed inside the SiC source material. Both are relatively simple measures which can be applied with little effort but still enable in particular a very high and preferably also homogenous doping of the growing SiC volume monocrystal with vanadium.

According to a further advantageous embodiment, nitrogen is added to the crystal growing area as an additional doping agent of the growing SiC volume monocrystal. In particular, a specific external supply of nitrogen is used for stabilising the modification and for improving the crystal quality of the growing SiC volume monocrystal. A certain amount of nitrogen in the growing SiC volume monocrystal suppresses polytype exchange which would otherwise occur during crystal growing. A nitrogen-doping agent concentration of the SiC volume monocrystal is preferably at least $5 \cdot 10^{16}$ cm$^{-3}$, at most preferably at least $1 \cdot 10^{17}$ cm$^{-3}$, and preferably at most $5 \cdot 10^{18}$ cm$^{-3}$, at most preferably $1 \cdot 10^{18}$ cm$^{-3}$. The nitrogen-doping agent concentration is advantageously at least 25% below the vanadium doping agent concentration, so that in particular there is a reliable and complete electrical compensation of the nitrogen doping and as a result the desired semi-insulating behaviour. By adding nitrogen in specifically controlled manner outside of the growth crucible, for example in gaseous form, the ratio between nitrogen and vanadium can be adjusted and the existence of possible nitrogen impurities can be dealt with. In this way a high nitrogen concentration, which is crucial for modification stability, can be set, having at the same time semi-insulating properties (compensation).

According to a further advantageous embodiment two SiC volume monocrystals are produced, whereby the growth crucible is provided with two separate crystal growing areas, between which the SiC supply area is positioned which is covered relative to each of the two crystal growing areas with a gas permeable membrane made of a porous material. This is particularly efficient, as by means of this method at the same time more than one SiC volume monocrystal can be grown.

To address the problem relating to the SiC substrate a SiC substrate is provided as follows. The monocrystalline SiC substrate according to the invention is one with a specific electrical resistance of at least $10^5$ Ωcm and in particular at most $10^{12}$ Ωcm, wherein the SiC substrate is doped with vanadium as a doping agent and has a global average value determined by the complete SiC substrate of a vanadium doping agent concentration of more than $5 \cdot 10^{17}$ cm$^{-3}$ and in particular of at most $1 \cdot 10^{19}$ cm$^{-3}$ and a local maximum value determined in any 1 mm$^3$ part volume of the SiC substrate of the vanadium doping agent concentration is at most 50% above the overall average value of the vanadium doping agent concentration.

The SiC substrate according to the invention is semi-insulating and accordingly has a high electrical resistance of in particular $10^{10}$ Ωcm or more, preferably even $10^{11}$ Ωcm or more. The high electrical resistance is in particular determined by the very high global average vanadium doping agent concentration of over $5 \cdot 10^{17}$ cm$^{-3}$. Advantageously the SiC substrate despite the high overall average vanadium doping agent concentration is free of macroscopic vanadium precipitations. Macroscopic precipitations are defined as those that extend at most in any direction by more than 1 μm. The SiC substrate is (largely) lacking vanadium precipitations overall. As already explained above in connection with the method according to the invention, the lack of precipitation is advantageous with respect to achieving the greatest possible electrical effectiveness of the doped vanadium and also with respect to having as few defects as possible in the SiC substrate. The SiC substrate also has a very high crystal quality.

Otherwise the SiC substrate according to the invention and preferred variants thereof have essentially the same advantages, as already described in connection with the method of production according to the invention and its preferred variants.

According to an advantageous embodiment the total average value of the vanadium-doping agent concentration is at least $6 \cdot 10^{17}$ cm$^{-3}$, in particular at least $7.5 \cdot 10^{17}$ cm$^{-3}$ and preferably at least $2 \cdot 10^{18}$ cm$^{-3}$. At such a vanadium doping agent concentration an even greater amount of flat imperfections can be compensated electrically.

According to a further advantageous embodiment an SiC crystal structure is provided with only a single SiC polytype, in particular one of the SiC polytypes 4H, 6H, 3C and 15R. Preferably, there is high modification stability which is characterised in particular by the broad absence of polytype changes. If the SiC substrate has only a single SiC polytype it also advantageously has only a very low number of defects. This results in a very high quality SiC substrate.

According to a further advantageous embodiment the SiC substrate has a main substrate surface with a substrate diameter of at least 7.62 cm and in particular at most 20 cm. The larger the substrate diameter the more efficiently can the monocrystalline SiC substrate be used for example for the production of semiconductor and/or high frequency components. In this way the component manufacturing costs are reduced. A SiC substrate with such a large diameter can also be used advantageously for the production of relatively large semiconductor and/or high frequency components, which have a base area of about 1 cm$^2$ for example.

According to a further advantageous embodiment the SiC substrate has a main substrate surface and an average micropipe density relative to the whole main substrate of at most 10 cm$^{-2}$, in particular at most 1 cm$^{-2}$. In this way a SiC substrate is provided that has very few defects, which is highly suitable for use in the production of semiconductor and/or high-frequency components.

According to a further advantageous embodiment nitrogen is added as an additional doping agent, and in particular the average nitrogen doping agent concentration over the whole SiC substrate is at least $5 \cdot 10^{16}$ cm$^{-3}$, preferably at least $1 \cdot 10^{17}$ cm$^{-3}$, and in particular at most $5 \cdot 10^{18}$ cm$^{-3}$, preferably at most $1 \cdot 10^{18}$ cm$^{-3}$. Nitrogen doping in this amount causes in particular an increase in the modification stability and preferably means that the SiC substrate essentially has only a single polytype and as a result is very low in defects. The crystalline quality is very high.

Other features which are considered as characteristic for the invention are set forth in the appended claims.

Although the invention is illustrated and described herein as embodied in a method for the production of a vanadium-doped SiC volume monocrystal and vanadium-doped SiC substrate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Corresponding parts have been given the same reference numerals in FIGS. 1 to 6. Details of the example embodiments explained in more detail in the following can represent an invention in themselves or form part of the subject matter of an invention.

Figure 1:
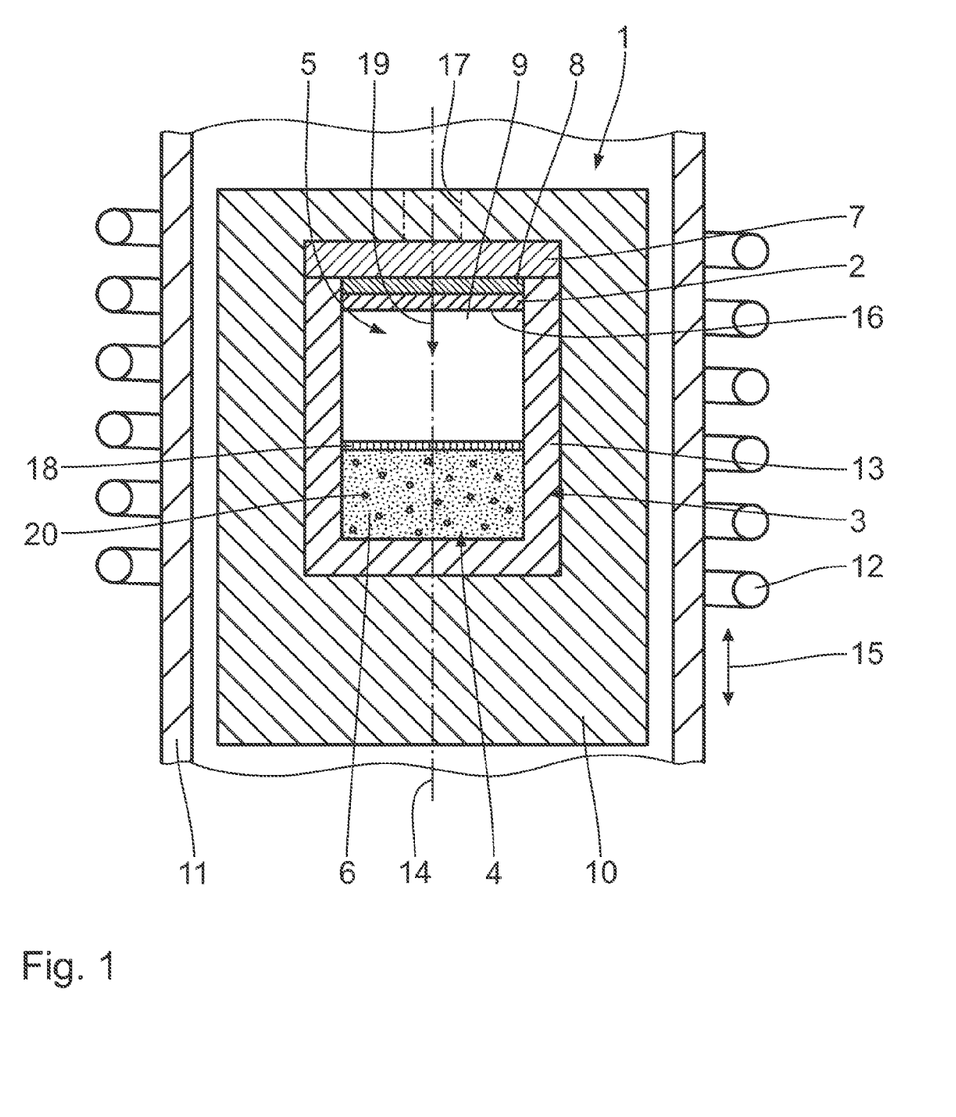
FIG. 1 shows an example embodiment of a growth arrangement with a covered SiC source material provided with vanadium-containing admixtures during the sublimation growth of a semi-insulating SiC volume monocrystal.

Referring now to the figures of the drawing in detail and first, particularly, to FIG. 1 thereof, there is shown an exemplary embodiment of a growth arrangement 1 for producing an SiC volume monocrystal 2 by way of sublimation growth. The growth arrangement 1 contains a growth crucible 3, which comprises an SiC supply area 4 and a crystal growing area 5. In the SiC supply area 4 is for example the powdered SiC source material 6, which is added to the SiC supply area 4 of the growth crucible 3 as a prefabricated starting material prior to beginning the growth process.

In the area of an end wall 7 of the growth crucible 3 opposite the SiC supply area 4 an SiC seed crystal 8 is attached extending axially into the crystal growing area 5. The SiC seed crystal 8 is in particular monocrystalline. The crucible end wall 7 is in the shown example embodiment designed as the lid of the growth crucible 3. However, this is not compulsory. On the SiC seed crystal 8 the SiC volume monocrystal 2 grows by depositing from an SiC growth gas phase 9 formed in the crystal growing area 5. The growing SiC volume monocrystal 2 and the SiC seed crystal 8 have approximately the same diameter. There is a difference of at most 10%, if at all, by which a seed diameter of SiC seed crystal 8 is smaller than a monocrystal diameter of the SiC volume monocrystal 2. However, between the inside of a crucible side wall 13 on the one hand and the growing SiC volume monocrystal 2 and the SiC seed crystal 8 on the other hand a gap can be provided, not shown in FIG. 1.

The growth crucible 3 including the crucible lid 7 consists in the example embodiment according to FIG. 1 of an electrically and thermally conductive graphite crucible material with a density of e.g. at least 1.75 g/cm$^{-3}$. Around the latter there is a thermal insulating layer 10. The latter consists e.g. of a foam-like graphite insulating material, the porosity of which is in particular significantly higher than that of the graphite crucible material.

The thermally insulated growth crucible 3 is placed inside a tubular container 11, which is configured in the example embodiment as a quartz glass tube and forms an autoclave or reactor. To heat the growth crucible 3 an inductive heating devices is arranged around the container 11 in the form of a heating coil 12. The growth crucible 3 is heated by means of the heating coil 12 to the temperatures required for growth. In the shown example embodiment said growing temperatures are at least 2250° C. The heating coil 12 couples an electric current inductively into the electrically conductive crucible side wall 13 of the growth crucible 3. Said electric current flows essentially as a circuit current in circumferential direction inside the circular and hollow cylindrical crucible side wall 13 and thereby heats the growth crucible 3. If necessary, the relative position between the heating coil 12 and the growth crucible 3 can be changed axially, i.e. in the direction of a central longitudinal axis 14 of the growing SiC volume monocrystal 2, in particular in order to adjust the temperature or the temperature curve inside the growth crucible 3 and if necessary also change it. The axially changeable position of the heating coil 12 during the growth process is indicated in FIG. 1 by the double arrow 15. In particular, the heating coil 12 is displaced adjusted to the growth stage of the growing SiC volume monocrystal 2. The displacement is preferably downwards, i.e. in the direction of the SiC source material 6, and preferably the same distance that the SiC volume monocrystal 2 grows, e.g. in total about 20 mm. For this the growth arrangement 1 comprises suitably designed control, regulating and adjusting means, which are not shown in detail.

The SiC growth gas phase 9 in the crystal growing area 5 is supplied by the SiC source material 6. The SiC growth gas phase 9 contains at least gas components in the form of Si, $Si_2C$ and $SiC_2$ (=SiC gas species). The transport of material from the SiC source material 6 to a growth boundary surface 16 on the growing SiC volume monocrystal 2 is performed on the one hand along an axial temperature gradient. At the growth boundary surface 16 there is a relatively high growing temperature of at least 2250° C., in particular even of at least 2350° C. or 2400° C.°. Furthermore, at the growth boundary surface 16 in particular an axial temperature gradient measured in the direction of the central longitudinal axis 14 is set of at least 5 K/cm, preferably at least 15 K/cm. The temperature inside the growth crucible 3 decreases to the growing SiC volume monocrystal 2. The highest temperature is about 2450° C. to 2550° C. in the region of the SiC supply area 4. Said temperature curve with a temperature difference of in particular 100° C. to 150° C. between the SiC supply area 4 and the growth boundary surface 16 can be achieved by various different means. Thus by means of a division of the heating coil 12, in a not shown manner, into two or more axial part sections an axially variable heating can be provided. Furthermore, in the lower section of the growth crucible 3, e.g. by a suitable axial positioning of the heating coil 12, a stronger heating effect can be achieved than in the upper section of the growth crucible 3. Furthermore, the heat insulation can be designed differently on the two axial crucible end faces. As shown schematically in FIG. 1 the thermal insulating layer 10 on the lower crucible end wall can have a greater thickness than on the upper crucible end wall. It is also possible that the thermal insulating layer 10 adjacent to the upper crucible end wall 7 has a central cooling opening 17 arranged about the central longitudinal axis 14, through which the heat is removed. Said central cooling opening 17 is indicated in FIG. 1 by the dashed lines.

Furthermore, the transport of material can also be influenced by the axial temperature gradients by additional transport influencing means. In the example embodiment according to FIG. 1 said additional transport influencing means is a gas-permeable membrane 18 covering the SiC source material 6 made of a porous material, which in the example embodiment according to FIG. 1 is in the form of a porous graphite with a specific density of about 1.2 g/cm$^{-3}$. Furthermore, the gas permeable membrane 18 has an axial thickness of 4 mm measured in the direction of the central longitudinal axis 14. Alternatively, the gas-permeable membrane 18 can also have a specific density of about 1.4 g/cm$^{-3}$ and an axial thickness of 2 mm.

In this case the gas permeable membrane 18 as in the example embodiment according to FIG. 1 can lie directly on the SiC source material 6 located in the SiC supply area 4. In a not shown alternative example embodiment the gas-permeable membrane 18 can however also be arranged at any (other) point as viewed in the direction of the central longitudinal axis 14 between the SiC supply area 4 and the crystal growing area 5.

Furthermore, in the growth crucible 3 during the actual crystal growth there is a growing pressure of in particular 5 hPa (=mbar) to 10 hPa (=mbar).

The SiC volume monocrystal 2 grows in a growth direction 19, which in the example embodiment shown in FIG. 1 is oriented from top to bottom, i.e. from the crucible lid 7 to the SiC supply area 4. The growth direction 19 runs parallel to the central longitudinal axis 14. As the growing SiC volume monocrystal 2 in the shown example embodiment is arranged concentrically inside the growth arrangement 1, the central longitudinal axis 14 can also be assigned as a whole to the growth arrangement 1.

Furthermore, the SiC growth gas phase 9 also contains at least one specifically added first doping agent, in this case vanadium (V). The vanadium available in the SiC growth gas phase 9 originates in the example embodiment according to FIG. 1 from vanadium-containing admixtures 20 contained in the SiC source material 6. The latter have been added or mixed to the SiC source material 6, for example in the form of elemental vanadium or vanadium compounds, prior to the actual growth. The powdered SiC source material 6 used here is thus pre-treated.

Vanadium produces a deep imperfection in the SiC band gap so that doped vanadium (i.e. embedded or incorporated into the SiC crystal lattice and suitable activated) compensates for flat imperfections which are caused by impurities or intrinsic defects. In addition, nitrogen which is practically unavoidable as an impurity acts as a flat imperfection in SiC and could in principle reduce the electrical resistance of the growing SiC volume monocrystal 2 particularly without compensation by the doped vanadium into the conductive range.

Owing to the high growing temperature at the growth boundary surface 16 an extraordinarily large amount of vanadium can be incorporated into the growing SiC volume monocrystal 2. The growing SiC volume monocrystal 2 is highly doped with vanadium and has a vanadium concentration of more than $5 \cdot 10^{17}$ cm$^{-3}$, in the example embodiment $2 \cdot 10^{18}$ cm$^{-3}$. Other example embodiments of grown SiC volume monocrystals 2 can also have vanadium concentrations in particular in the range of between $6 \cdot 10^{17}$ cm$^{-3}$ and $4 \cdot 10^{18}$ cm$^{-3}$. Here the incorporated vanadium is available in a practically precipitation free form in the crystal lattice of the SiC volume monocrystal 2 and is also electrically effective in the large incorporated amount.

Therefore, flat imperfections, which are created specifically but not only by nitrogen, are compensated very well so that the growing SiC volume monocrystal 2 has a comparatively high specific electrical resistance of at least $10^5$ Ωcm and exhibits semi-insulating behaviour. In the example embodiment said resistance is $1 \cdot 10^{11}$ Ωcm. Other example embodiments of thus grown SiC volume monocrystals 2 can also have a specific electrical resistance in particular in a range between $5 \cdot 10^{10}$ Ωcm and $3 \cdot 10^{11}$ Ωcm. Furthermore, the SiC is a 6H-polytype. In principle however another polytype is also possible (=a different crystal modification), such as e.g. 4H-SiC, 3C-SiC or 15R-SiC. Advantageously, the SiC volume monocrystal 2 only has a single SiC polytype, which in the example embodiment is said 6H-SiC. The SiC volume monocrystal 2 grows with a high modification stability and thus has essentially only a single polytype.

This advantageous modification stability is achieved by specific nitrogen doping. A specific nitrogen content is already provided in the SiC volume monocrystal 2 because of the said impurities. Optionally additional gaseous nitrogen can be supplied via a supply line not shown in FIG. 1 as a second doping agent to the crystal growing area 5, in order to adjust a required amount of nitrogen in the SiC growth gas phase 9 specifically and in particular also to be controllable from outside of the growth crucible 3. The nitrogen doping agent concentration of the growing SiC volume monocrystal 2 is in particular about $5 \cdot 10^{16}$ cm$^{-3}$ or about $5 \cdot 10^{17}$ cm$^{-3}$, which is a relatively high value and opposes a semi-insulating behaviour of the SiC volume monocrystal 2. Owing to the also even higher concentration of non-precipitation incorporated vanadium, this high nitrogen concentration is still compensated for. Both the said high specific electrical resistance and also a crystal structure are present with practically only a single modification. The latter is an advantage with respect to very low defect high crystal quality.

The crystal quality worsens in the case of polytype exchange. The various SiC polytypes differ in their respective crystal structures. Exchanges between different polytypes can easily occur during crystal growing and are the cause of many different crystalline defects, such as e.g. micropipes, displacements, embedding of foreign modifications, which worsen the crystalline quality. By adding a sufficiently large amount of nitrogen into the SiC growth gas phase 9 the occurrence of only one polytype during the crystal growth is stabilised and thus the formation of defects by polytype exchange are minimised. In this way, SiC volume monocrystals 2 can be produced of high quality and in a high yield.

To obtain a SiC volume monocrystal 2 with semi-insulating behaviour and high crystal quality an important aspect is thus in particular as far as possible the precipitation-free embedding of a very high vanadium doping agent into the crystal lattice. In order to obtain a precipitation-free vanadium doping agent concentration of more than $5 \cdot 10^{17}$ cm$^{-3}$ at the growth boundary surface 16 the aforementioned high growing temperature is set to at least 2250° C. It has been recognised that by means of a high growing temperature the solubility limit for vanadium in a growing SiC crystal can be raised above a concentration of $5 \cdot 10^{17}$ cm$^{-3}$, so that also a vanadium concentration above said value can be embedded essentially precipitation free into a growing SiC crystal lattice.

In the sublimation method (=PVT method) used for SiC crystal growth the growth conditions including the transport of material are adjusted and controlled by the temperatures in the growth crucible 3. A change in the growing temperature at the growth boundary surface 16 thus influences the remaining growth conditions, also in particular the transport of material from the SiC supply area 4 to the growth boundary surface 16.

Without suitable additional means the simple increase in the growing temperature could thus also lead to a change in the other growth conditions. In particular, a higher growth rate and thereby an increase in the defect formation can be adjusted in the growing SiC volume monocrystal 2. In order to avoid said negative effects of a higher growing temperature at the growth boundary surface 16, the growth arrangement 1 with the first gas-permeable membrane 18 is an adequate solution. By means of the first gas permeable membrane 18 the transport of material from the SiC supply area 4 to the growth boundary surface 16 located in the crystal growing area 5 can be adjusted. In particular, said transport of material can be controlled by means of the first gas-permeable membrane 18 so that despite the high growing temperature at the growth boundary surface 16 the resulting growth rate is not too high. The transport of material to the growing SiC volume monocrystal 2 can be adjusted specifically in particular by the permeability of the first gas permeable membrane 18.

In general, by means of said transport influencing means it is thus possible to achieve a decoupling of the growing temperature at the growth boundary surface 16 from the transport of material to the boundary surface 16. The growing temperature at the growth boundary surface 16 and the transport of material to the latter can be influenced at least largely independently of one another.

Thus the growth arrangement 1 meets all of the requirements for producing a high quality semi-insulating SiC volume monocrystal 2.

Figure 2:
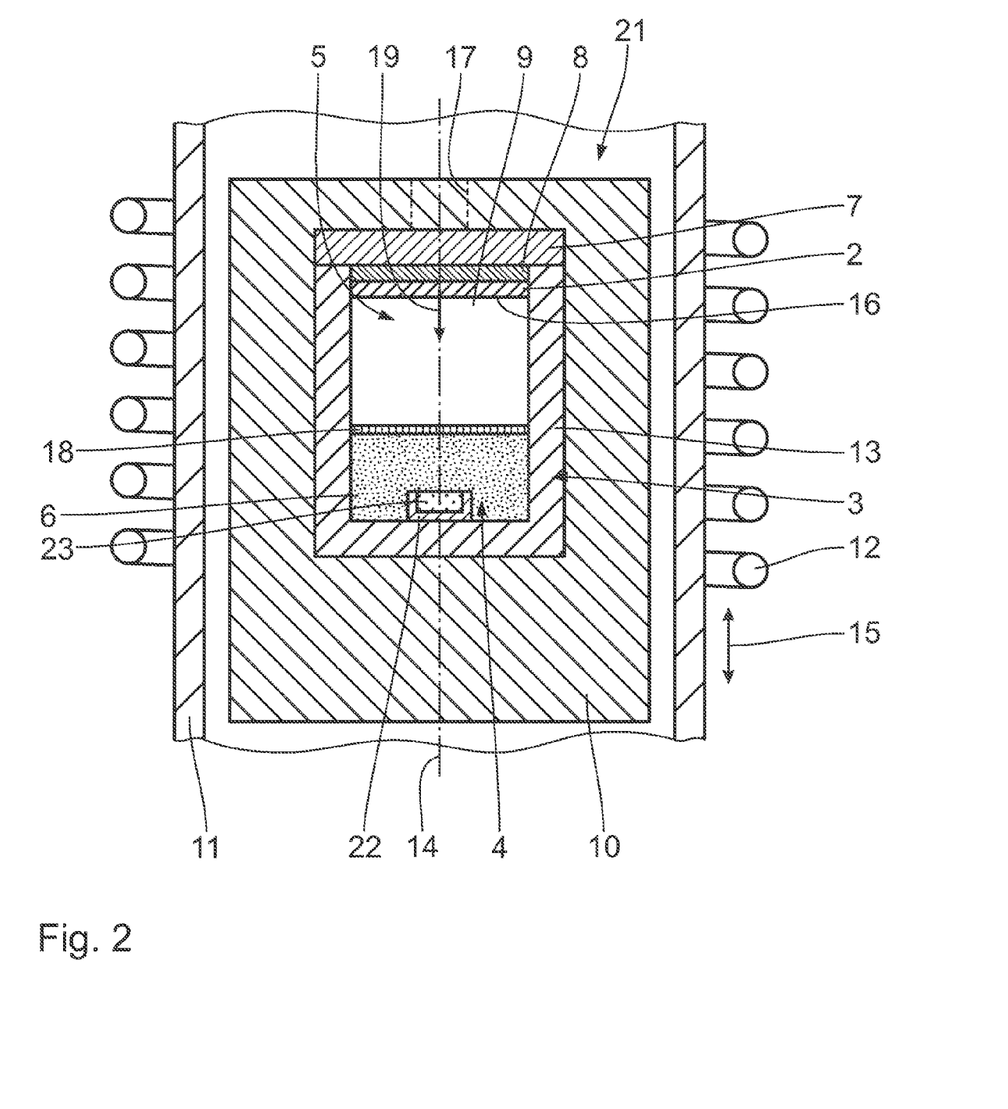
FIG. 2 shows a further example embodiment of a growth arrangement with a covered SiC source material provided with a vanadium-filled supply container during the sublimation growth of a semi-insulating SiC volume monocrystal.

FIG. 2 shows an example embodiment of a further growth arrangement 21 which differs from the growth arrangement 1 according to FIG. 1 only by the introduction of the first doping agent vanadium into the SiC supply area 4. Instead of the vanadium-containing admixtures 20 provided in the growth arrangement 1 in the SiC source material 6 in the growth arrangement 21 an open doping agent container 22 is placed in the SiC source material 6. In particular, the doping agent container 22 stands on the bottom of the growth crucible 3 and is surrounded by the SiC source material 6. In the doping agent container 22 there is a vanadium-containing material 23, for example in the form of elementary vanadium or a vanadium compound.

By means of both the vanadium-containing admixtures 20 and also by means of the open doping agent container 22 filled with vanadium-containing material 23 the homogenous incorporation of vanadium into the growing SiC volume monocrystal 2 is achieved. The incorporation of vanadium is also controlled by the growing temperature at the growth boundary surface 16 and by the homogenisation of the gas phase during the transport of material to the growth boundary surface 16. Both the addition of the vanadium-containing admixtures 20 into the SiC source material 6 and also the placing of the open doping agent container 22 filled with vanadium into the SiC source material 6 are comparatively simple measures or methods for controlling the doping agent flow or incorporation. Owing to the aforementioned advantageous decoupling of the transport of material to the growth boundary surface 16 from the growing temperature at the growth boundary surface 16 otherwise much more complicated methods for controlling the doping agent flow can be dispensed with, such as e.g. the use of encapsulated reservoirs or external gas supply lines, in any case in association with the vanadium supply and doping.

Figure 3:
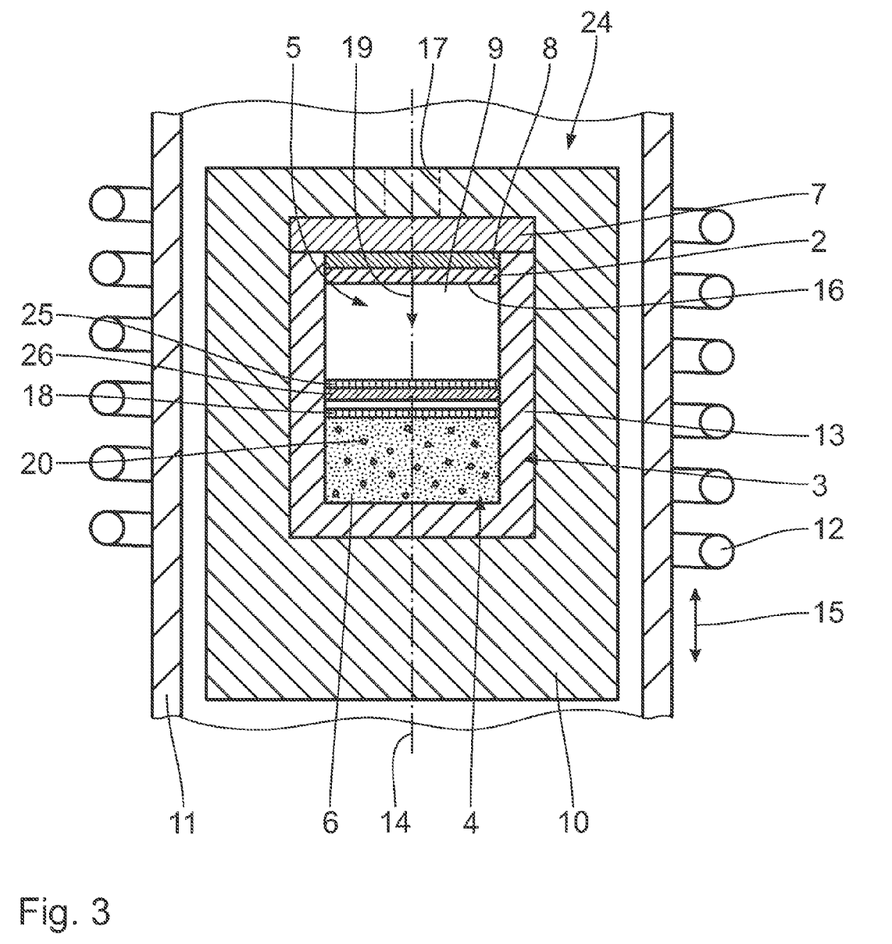
FIGS. 3 and 4 show further example embodiments of growth arrangements with a one or two-step resublimation during the sublimation growth of a semi-insulating SiC volume monocrystal.

In the additional example embodiment shown in FIG. 3 of a growth arrangement 24 compared to the growth arrangement 1 according to FIG. 1 apart from the first gas-permeable membrane 18 covering the SiC supply area 4 a second gas-permeable membrane 25 can be provided which is positioned between the first gas-permeable membrane 18 and the crystal growing area 5. The second gas permeable membrane 25 consists of porous graphite, but has a lower porosity than the first gas-permeable membrane 18. The second gas-permeable membrane 25 has a density of about 1.4 g/cm$^3$ and a thickness of 4 mm.

Because of the special construction of the growth arrangement 24 with the two gas-permeable membranes 18 and 25 a resublimation of the SiC source material 6 is performed. Thus the gaseous material released (sublimated) from the SiC source material 6 at a relatively high rate penetrates the first gas-permeable membrane 18 and crystallises on a lower side of the second gas-permeable membrane 25 facing the first gas-permeable membrane 18 as a first polycrystalline SiC material block 26. The gaseous material released (sublimated) from the first polycrystalline SiC material block 26 then penetrates the second gas-permeable membrane 25 and then forms the starting material for the SiC growth phase 9, from which the SiC volume monocrystal 2 in the crystal growing area 5 grows. By means of this resublimation, in which the first polycrystalline SiC material block 26 is formed, the transport of material to the growth boundary surface 16 of the growing SiC volume monocrystals 2 can be controlled very well and mainly also independently of the growing temperature at the growth boundary surface.

Figure 4:
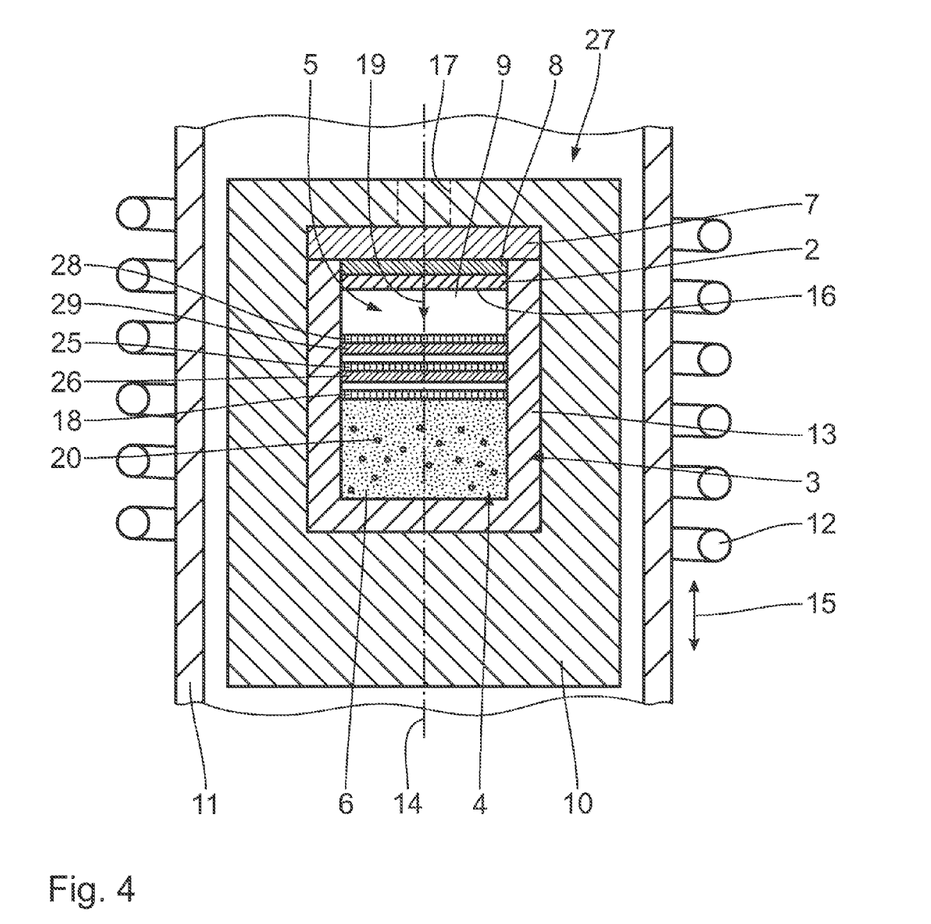

It is possible achieve an even finer control of the transport of material to the growth boundary surface 16 if the resublimation is performed not as in the growth arrangement 24 according to FIG. 3 in a single step, but in multiple steps. An example embodiment of a growth arrangement 27 as an example of such a multi-step resublimation is shown in FIG. 4. It comprises a resublimation in two steps. For this a third gas-permeable membrane 28 is placed between the second gas-permeable membrane 25 and the crystal growing area 5. The porosity and the thickness of the third gas-permeable membrane 28 differ from the corresponding parameters of the first and second gas-permeable membrane 18 or 25. In particular, the third gas-permeable membrane 28, which is also made of porous graphite, has an even lower porosity than the second gas-permeable membrane 25. Its density is about 1.6 g/cm$^3$ and its thickness 4 mm. Alternatively, the third gas-permeable membrane 28 can also have a specific density of about 1.4 g/cm$^3$ and an axial thickness of 6 mm.

Figure 5:
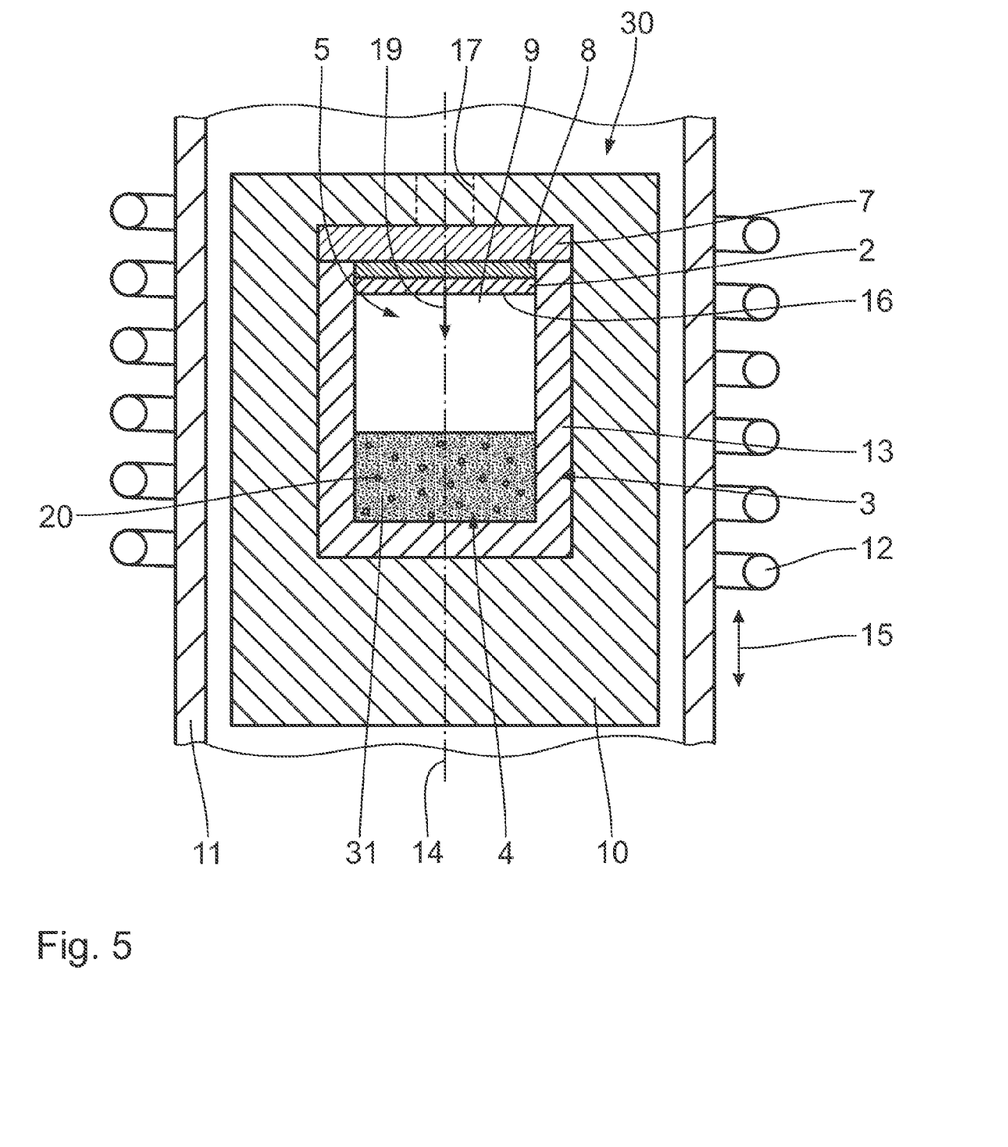
FIG. 5 shows a further example embodiment of a growth arrangement with an SiC source material of high density during the sublimation growth of a semi-insulating SiC volume monocrystal.

In the additional example embodiment of a growth arrangement 30 shown in FIG. 5 another means is provided for controlling the transport of material to the growth boundary surface 16. In the SiC supply area 4, which is not covered in the growth arrangement 30, there is another powdered SiC source material 31, which compared to the SiC source material 6 of the previously explained growth arrangements 1, 21, 24 and 27 has a higher bulk density (=grain size) of the powder grains and thereby a smaller free area of the SiC source material 31 overall. The density of the powdered SiC source material 31 is in the example embodiment according to FIG. 5 1.3 g/cm$^3$. By changing the density of the SiC source material 31 the sublimation temperature can be changed. The higher the density and thus the smaller the free area of the SiC source material 31, the higher the sublimation temperature. By increasing the density a higher sublimation temperature can be set. In this way the temperature of the whole structure of the growth arrangement 30, i.e. the temperature of the SiC source material 31 and the temperature in the crystal growing area 5, in particular the growing temperature at the growth boundary surface 16, can also be increased without changing the transport of SiC source material 31 to the growth boundary surface 16 and the other growth conditions including the growing speed.

The use of a SiC source material 31 with a higher density is thus also a transport influencing means, which makes it possible at the growth boundary surface 16 to set the desired higher growing temperature, without having to take into account negative effects, such as for example a greater rate of material transport and associated therewith a larger number of defects in the growing SiC volume monocrystal 2.

The doping with the first doping agent vanadium is performed in the growth arrangements 24, 27 and 30 respectively by means of vanadium containing admixtures 20 to the respective SiC source material 6 or 31. There are however alternative example embodiments, which are not shown in the figures, to the growth arrangements 24, 27 and 30, in which the vanadium is supplied not by means of the vanadium-containing admixtures 20, but instead by means of the open doping agent container 22 shown in FIG. 2 and filled with vanadium-containing material 23.

Figure 6:
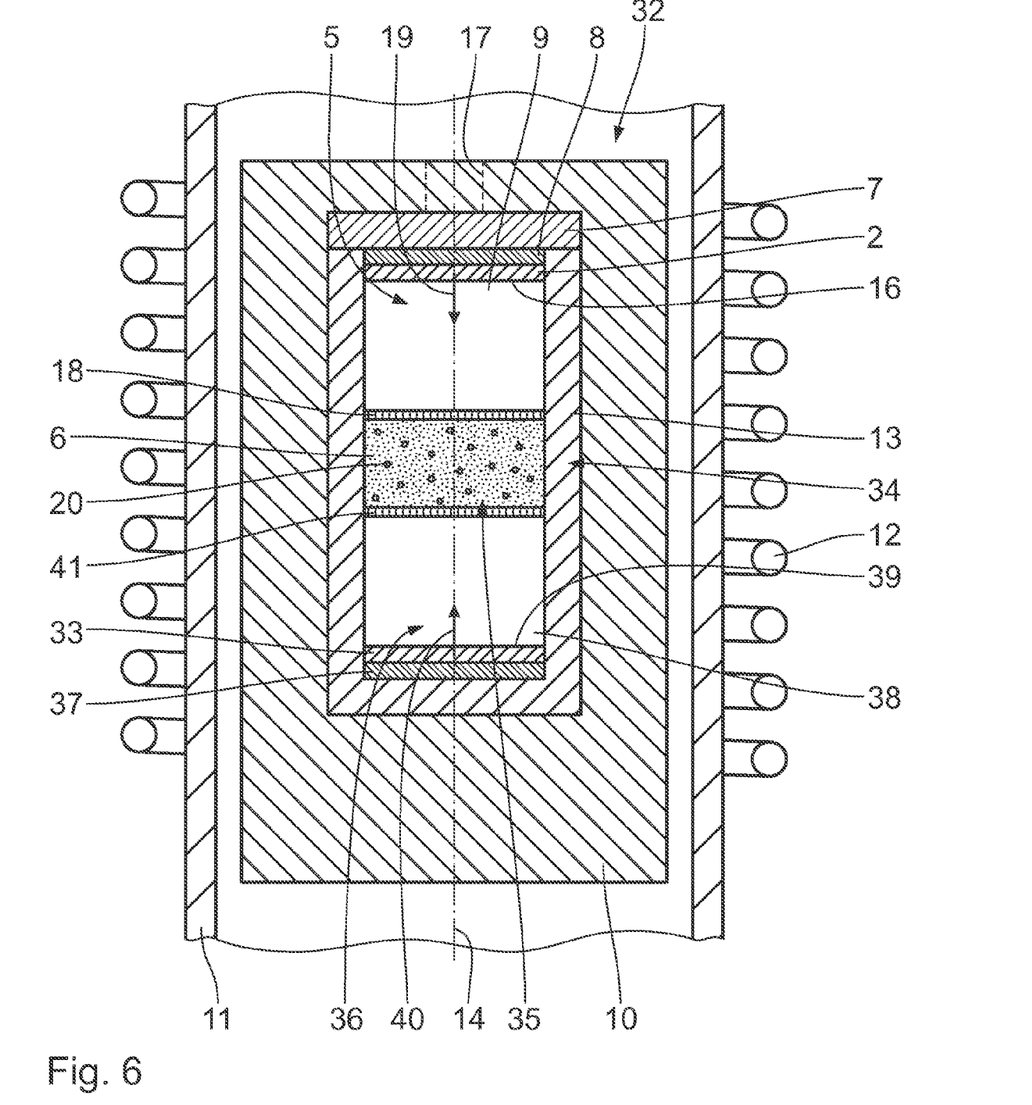
FIG. 6 shows a further example embodiment of a growth arrangement with an SiC source material covered on two sides and provided with vanadium-containing admixtures during the sublimation growth of two semi-insulating SiC volume monocrystals.

FIG. 6 shows a further example embodiment of a growth arrangement 32 which is designed in a similar way to the growth arrangement 1. By means of the growth arrangement 32 parallel to a SiC volume monocrystal 2 a second SiC volume monocrystal 33 can be produced. For this, the structure provided for the growth arrangement 1 inside the growth crucible 3 is essentially doubled by reflecting from the bottom of the growth crucible 3. The growth arrangement 32 thus contains a growth crucible 34, in which a SiC supply area 35 is not arranged on the bottom but centrally as viewed in the direction of the central longitudinal axis 14. Above the SiC supply area 35 the first crystal growing area 5 is arranged below a second crystal growing area 36. One of the two SiC volume monocrystals 2 and 33 grows in the two crystal growing areas 5 and 36 respectively. On the bottom of the growth crucible 34 a second SiC seed crystal 37 is arranged, on which the second SiC volume monocrystal 33 grows from a SiC growth phase 38 forming in the crystal growing area 36 and supplied by the SiC source material 6. Here a growth boundary surface 39 of the second SiC volume monocrystal 33 is displaced in the direction of a growth direction 40 oriented parallel to the central longitudinal axis 14 but opposite the growth direction 19 of the first SiC volume monocrystal. The SiC supply area 34 is covered at the top by the first gas-permeable membrane 18 and at the bottom by the fourth gas-permeable membrane 41. The SiC source material 6 is thus located between the two gas-permeable membranes 18 and 41.

Overall, the result is in particular a structure inside the growth crucible 34 that is mirrored or symmetrical relative to a cross plane in the direction of the middle longitudinal axis 14 which is arranged centrally in the direction of the central longitudinal axis 14 inside the SiC supply area 35 and transverse to the central longitudinal axis 14 (not shown in FIG. 6).

The growth of the two semi-insulating SiC volume monocrystals 2 each doped with vanadium is performed as described above with reference to the growth arrangement 1. In particular, at the growth boundary surface 39 of the second SiC volume monocrystal 33 a high growing temperature is set in order to enable a precipitation-free incorporation of a high vanadium doping agent concentration. By means of the two gas-permeable membranes 18 and 41 for both SiC volume monocrystals 2 and 33 respectively there is a decoupling of the control of the transport of material from the SiC supply area 34 to the respective growth boundary surface 16 or 39.

Only the optional axial displacement of the heating coil 12 according to the growth progression of the growing SiC volume monocrystal 2 in the example embodiments according to FIGS. 1 to 5 is omitted in the growth arrangement 32 according to FIG. 6 because of the structure with the two upper and lower crystal growing areas 5 and 36 which are mirrored and symmetrical relative to the SiC supply area 35 in the direction of the central longitudinal axis 14.

By means of the growth arrangements 1, 21, 24, 27, 30 and 32 very low defect, high quality semi-insulating SiC volume monocrystals 2, 33 can be produced. From said high quality semi-insulating SiC volume monocrystals 2, 33 also high-quality semi-insulating SiC substrates can be produced. Said disc-like SiC substrates are obtained from the relevant SiC volume monocrystal 2 or 33 in that they are cut or sawn off axially in succession as discs perpendicular to the growth direction 19 or 40 or to the central longitudinal axis 14. An SiC substrate of this kind is large and thin. In one possible embodiment its main substrate surface has a substrate diameter of at least 7.62 cm, for example 15 cm, whereas a substrate thickness is about 500 µm. Also the thus produced SiC substrates are semi-insulating and have in particular a specific electrical resistance of $1 \cdot 10^{11}$ Ωcm. However, other resistance values are also possible, in particular in a range between $5 \cdot 10^{10}$ Ωcm and $3 \cdot 10^{11}$ Ωcm. The vanadium-doping agent concentration is above $5 \cdot 10^{17}$ cm$^{-3}$, in particular $1 \cdot 10^{18}$ cm$^{-3}$ or $2 \cdot 10^{18}$ cm$^{-3}$, whereby this is the overall average value of the vanadium-doping agent concentration determined over the whole SiC. The vanadium concentration of the SiC substrate can in particular have values from a range between $6 \cdot 10^{17}$ cm$^{-3}$ and $4 \cdot 10^{18}$ cm$^{-3}$. The high vanadium doping agent concentration is essentially precipitation free in the crystal structure of the semi-insulating SiC substrate. This means that there are no expanded part areas with a local vanadium doping agent concentration that is a lot higher. To this extent the local maximum value of the vanadium doping agent concentration of any 1 mm$^3$ part volume of the SiC substrate is at most 50% above the said overall average value of the vanadium doping agent concentration. The SiC substrate is thus free of macroscopic vanadium precipitations, whereby macroscopic precipitations are defined as those with a randomly oriented greatest extension of more than 1 µm. The semi-insulating SiC substrates essentially comprises only a single SiC polytype, for example 4H-SiC, 6H-SiC, 3C-SiC or 15R-SiC. Furthermore, the SiC substrates can be doped with the second doping agent nitrogen, as described above in connection with the SiC volume monocrystal 2.

In a simplified abstract summary, the above-described method is suitably used for the production of at least one SiC volume monocrystal 2 with a specific electrical resistance of at least $10^5$ Ωcm, wherein in at least one crystal growing area 5 of a growth crucible 3 an SiC growth gas phase 9 is generated and the SiC volume monocrystal 2 grows by depositing from the SiC growth gas phase 9. The SiC growth gas phase 9 is supplied from a SiC source material 6, which is located in an SiC supply area 4 inside the growth crucible 3, the material being transported from the SiC supply area 4 to a growth boundary surface 16 of the growing SiC volume monocrystal 2. Vanadium is added to the crystal growing area 5 as a doping agent of the growing SiC volume monocrystal 2. At the growth boundary surface 16 of the growing SiC volume monocrystal 2 a growing temperature is set of at least 2250° C. so that the SiC volume monocrystal 2 grows doped with a vanadium doping agent concentration of more than $5 \cdot 10^{17}$ cm$^{-3}$. The transport of material from the SiC supply area 4 to the growth boundary surface 16 is additionally adapted to the temperature conditions in the growth crucible 3 by means of an additional transport influencing means 18, so that the growing temperature at the growth boundary surface 16 and the transport of material to the growth boundary surface 16 can be influenced largely independently of one another.

The invention claimed is:

1. A method for the production of at least one SiC volume monocrystal with a specific electrical resistance of at least $10^5$ Ωcm, the method comprising:
   a) producing an SiC growth gas phase in at least one crystal growing area of a growth crucible and growing the SiC volume monocrystal by deposition from the SiC growth gas phase;
   b) supplying the SiC growth gas phase from an SiC source material that is located in an SiC supply area inside the growth crucible, wherein material is transported from the SiC supply area to a growth boundary surface of the growing SiC volume monocrystal;
   c) supplying vanadium as a doping agent of the growing SiC volume monocrystal to the crystal growing area;
   d) setting a growing temperature of at least 2250° C. at the growth boundary surface of the growing SiC volume monocrystal, to grow the SiC volume monocrystal doped with a vanadium doping agent concentration of more than $5 \cdot 10^{17}$ cm$^{-3}$; and
   e) setting the transport of material from the SiC supply area to the growth boundary surface in addition to the temperature conditions in the growth crucible by way of an additional transport influencing measure, so that the growing temperature at the growth boundary surface and the transport of material to the growth boundary surface is influenced substantially independently of one another, the additional transport influencing measure including providing the SiC source material in the SiC supply area in the form of a powdered SiC material with a specific density in a range between 0.8 g/cm$^3$ and 3.2 g/cm$^3$.

2. The method according to claim 1, which comprises providing a further additional transport influencing measure being at least one gas-permeable membrane made from a porous material arranged between the SiC supply area and the crystal growing area.

3. The method according to claim 1, which comprises providing a further additional transport influencing measure by performing at least one resublimation step during the transport of material from the SiC supply area and to the growth boundary surface.

4. The method according to claim 1, which comprises adding the vanadium to be incorporated as a doping agent into the growing SiC volume monocrystal prior to an actual growth of the SiC volume monocrystal to the SiC source material or to an open doping agent container placed inside the SiC source material.

5. The method according to claim 1, which comprises supplying nitrogen to the crystal growing area as an additional doping agent of the growing SiC volume monocrystal.

6. The method according to claim 1, which comprises providing the growth crucible with two separate crystal growing areas having the SiC supply area positioned therebetween, and wherein the SiC supply area is covered relative to each of the two crystal growing areas with a gas-permeable membrane made of a porous material, and producing in the growth crucible two SiC volume monocrystals.

7. A monocrystalline SiC substrate, comprising:
a vanadium-doped monocrystalline SiC substrate having a specific electrical resistance of at least $10^5$ Ωcm, and wherein:
said SiC substrate has a main substrate surface with a substrate diameter of at least 7.62 cm;
said SiC substrate is doped with vanadium as a doping agent and has an overall average value of a vanadium doping agent concentration over an entire said SiC substrate of more than $5 \cdot 10^{17}$ cm$^{-3}$; and
a local maximum value of the vanadium doping agent concentration determined in any 1 mm$^3$ partial volume of said SiC substrate lies at most 50% above the overall average value of the vanadium doping agent concentration.

8. The SiC substrate according to claim 7, wherein the overall average value of the vanadium doping agent concentration is at least $6 \cdot 10^{17}$ cm$^{-3}$.

9. The SiC substrate according to claim 7, wherein an SiC crystal structure is provided with only a single SiC polytype.

10. The SiC substrate according to claim 7, wherein an SiC crystal structure is provided with one SiC polytype selected from the group consisting of 4H, 6H, 3C and 15R.

11. The SiC substrate according to claim 7, wherein the SiC substrate has a main substrate surface and an average micropipe density relative to the total main substrate surface of at most 10 cm$^{-2}$.

12. The SiC substrate according to claim 7, which further comprises nitrogen as an additional doping agent with a nitrogen doping agent concentration of at least $5 \cdot 10^{16}$ cm$^{-3}$.

13. A method for the production of at least one SiC volume monocrystal with a specific electrical resistance of at least $10^5$ Ωcm, the method comprising:
a) producing an SiC growth gas phase in at least one crystal growing area of a growth crucible and growing the SiC volume monocrystal by deposition from the SiC growth gas phase;
b) supplying the SiC growth gas phase from an SiC source material that is located in an SiC supply area inside the growth crucible, wherein material is transported from the SiC supply area to a growth boundary surface of the growing SiC volume monocrystal;
c) supplying vanadium as a doping agent of the growing SiC volume monocrystal to the crystal growing area;
d) setting a growing temperature of at least 2250° C. at the growth boundary surface of the growing SiC volume monocrystal, to grow the SiC volume monocrystal doped with a vanadium doping agent concentration of more than $5 \cdot 10^{17}$ cm$^{-3}$; and
e) setting the transport of material from the SiC supply area to the growth boundary surface in addition to the temperature conditions in the growth crucible by performing at least one resublimation step during the transport of material from the SiC supply area and to the growth boundary surface, so that the growing temperature at the growth boundary surface and the transport of material to the growth boundary surface is influenced substantially independently of one another, the additional transport influencing measure comprises.

* * * * *